United States Patent
Takahashi

(10) Patent No.: US 8,063,388 B2
(45) Date of Patent: Nov. 22, 2011

(54) ION IMPLANTATION APPARATUS, SUBSTRATE CLAMPING MECHANISM, AND ION IMPLANTATION METHOD

(75) Inventor: Hidenori Takahashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 137 days.

(21) Appl. No.: 12/702,779

(22) Filed: Feb. 9, 2010

(65) Prior Publication Data
US 2010/0133449 A1     Jun. 3, 2010

Related U.S. Application Data

(63) Continuation of application No. PCT/JP2007/066855, filed on Aug. 30, 2007.

(51) Int. Cl.
*H01J 37/20*     (2006.01)
*H01J 37/08*     (2006.01)

(52) U.S. Cl. ............... 250/492.2; 250/491.1; 250/492.1; 250/492.21

(58) Field of Classification Search ............... 250/491.1, 250/492.1, 492.2, 492.21, 492.22, 492.3
See application file for complete search history.

(56) References Cited

U.S. PATENT DOCUMENTS

| | | | |
|---|---|---|---|
| 6,555,825 B1 * | 4/2003 | Mitchell et al. | 250/398 |
| 7,385,208 B2 * | 6/2008 | Cheng et al. | 250/492.21 |
| 2007/0023695 A1 * | 2/2007 | Cheng et al. | 250/492.21 |

FOREIGN PATENT DOCUMENTS

| | | |
|---|---|---|
| JP | 3-091656 U | 9/1991 |
| JP | 6-076783 A | 3/1994 |
| JP | 7-335585 A | 12/1995 |
| JP | 2003-501828 A | 1/2003 |
| JP | 2004-253756 A | 9/2004 |
| JP | 2005-203726 A | 7/2005 |

OTHER PUBLICATIONS

International Search Report of PCT/JP2007/066855, mailing date of Nov. 27, 2007.

* cited by examiner

*Primary Examiner* — Bernard E Souw
(74) *Attorney, Agent, or Firm* — Westerman, Hattori, Daniels & Adrian, LLP

(57) ABSTRACT

Provided is an ion implantation apparatus including a disk which rotates about a first axis, a pad which is rotatable about a second axis on the disk, and on which a substrate is placed with a holder attached to a circumference of the substrate, the holder including a weight, fixing pins which are each fixedly provided on a portion on the disk around the pad, a sliding piece which slides, by its own centrifugal force, on the disk with a rotational movement of the disk and thereby clamps the holder in cooperation with the fixing pins, and an ion beam generator which irradiates the substrate with ion beams.

16 Claims, 15 Drawing Sheets

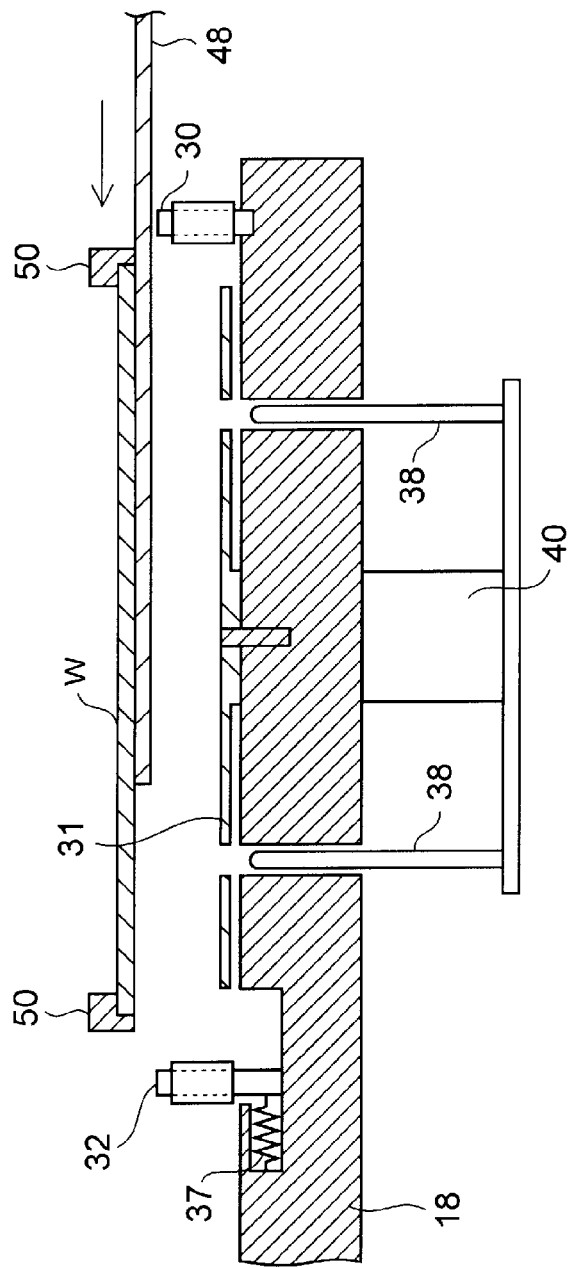
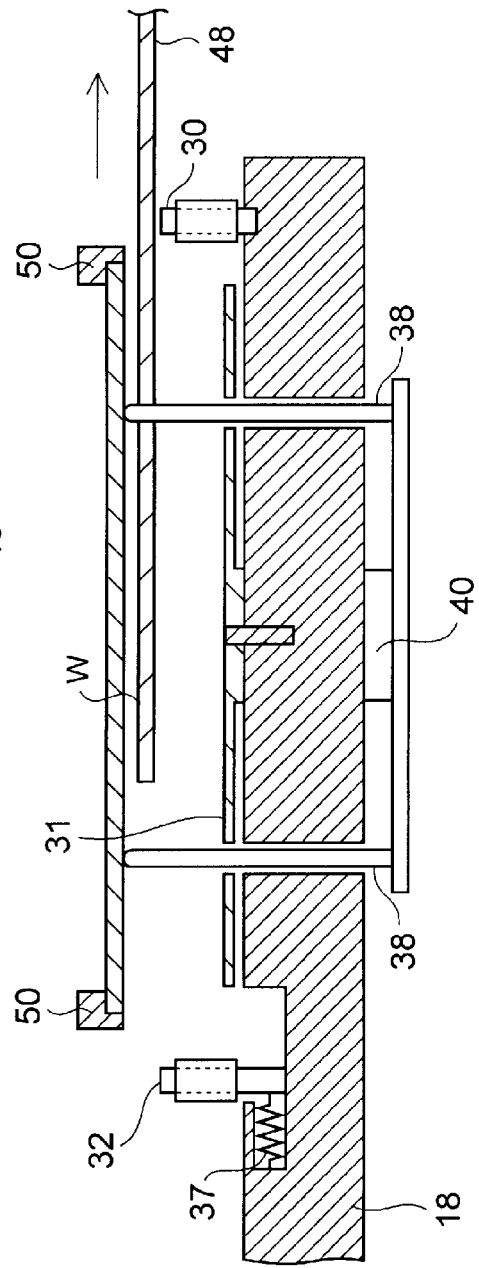
FIG. 8A
FIG. 8B

ION IMPLANTATION APPARATUS, SUBSTRATE CLAMPING MECHANISM, AND ION IMPLANTATION METHOD

CROSS-REFERENCE TO RELATED APPLICATIONS

This application is based upon prior International Patent Application No. PCT/JP2007/66855, filed on Aug. 30, 2007, the entire contents of which are incorporated herein by reference.

FIELD

It is related to an ion implantation apparatus, a substrate clamping mechanism, and an ion implantation method.

BACKGROUND

For semiconductor devices such as LSIs, various types of ion implantation are performed on semiconductor substrates for the purpose of forming impurity diffusion regions such as wells.

Ion implantation apparatuses for use in the ion implantation are roughly classified into single-wafer type apparatuses and batch type apparatuses. Among these apparatuses, the batch type apparatuses are capable of performing the collective ion implantation on multiple semiconductor substrates, and are hence more efficient than the single-wafer type apparatuses.

The batch type ion implantation apparatuses have a mechanism in which multiple semiconductor substrates are disposed on the periphery of a circular disk, and are irradiated with ion beams while the disk is rapidly rotated.

A clamping mechanism is provided on the disk in order to fix the semiconductor substrates on the disk. The clamping mechanism prevents the semiconductor substrates from dropping off from the disk during the ion implantation.

However, if the clamping mechanism is not correctly aligned with an orientation flat of the semiconductor substrate, the semiconductor substrate cannot be fitted into a predetermined position of the clamping mechanism. As a result, the semiconductor substrate may possibly be dropped off. Additionally, with such incorrect alignment, the clamping mechanism can exert only an insufficient force to fix the semiconductor substrates on the disk. Consequently, the semiconductor substrate sometimes drops off from the disk, soon after a rotation of the disk is started.

In addition, since an ion implantation direction is determined depending on an orientation of the orientation flat of the semiconductor substrate, the orientation flat of the semiconductor substrate needs to be correctly aligned with the disk in order to form the semiconductor device having predetermined electrical characteristics.

It should be noted that the technologies related to the present application are disclosed in Japanese Laid-open Patent publication No. Hei 7-335585, Japanese Laid-open Patent publication No. 2004-253756, and Japanese Laid-open Patent publication No. 2005-203726.

SUMMARY

According to one aspect discussed herein, there is provided an ion implantation apparatus including a disk which rotates about a first axis, a pad which is rotatable about a second axis on the disk, and on which a substrate is placed with a holder attached to a circumference of the substrate, the holder including a weight, a fixing piece which is fixedly provided on a portion of the disk around the pad, a fixing piece which is fixedly provided to a portion of the disk around the pad, a sliding piece which slides, by its own centrifugal force, on the disk by a rotational movement of the disk and thereby clamps the holder in cooperation with the fixing piece, and an ion beam generator which irradiates the substrate with an ion beam.

According to another aspect discussed herein, there is provided a substrate clamping mechanism including a pad which is provided rotatably about a second axis on a disk configured to rotate about a first axis, and on which a substrate is placed with a holder attached to a circumference of the substrate, the holder including a weight, a fixing piece which is fixedly provided to a portion of the disk around the pad, and a sliding piece which slides, by its own centrifugal force, on the disk by a rotational movement of the disk and thereby clamps the holder in cooperation with the fixing piece.

According to still another aspect discussed herein, there is provided an ion implantation method including placing a substrate on a rotatable pad on a disk with a holder attached to a circumference of the substrate, the holder including a weight, pressing a sliding piece provided on the disk against the holder by a centrifugal force of the sliding piece by a rotation of the disk, and thereby clamping the holder by the sliding piece and a fixing piece fixedly provided on the disk, and, after the clamping, irradiating the substrate with an ion beam while rotating the disk.

Other Objects and further features of the present application will become apparent from the following detailed description when read in conjunction with the attached drawings.

BRIEF DESCRIPTION OF THE DRAWINGS

FIGS. 8A to 8C are cross-sectional views each for explaining the giving and receiving of the semiconductor substrate on the disk;

DESCRIPTION OF EMBODIMENT

Next, an embodiment of the present invention is described in detail with reference to the accompanying drawings.

Ion Implantation Apparatus

Figure 1:
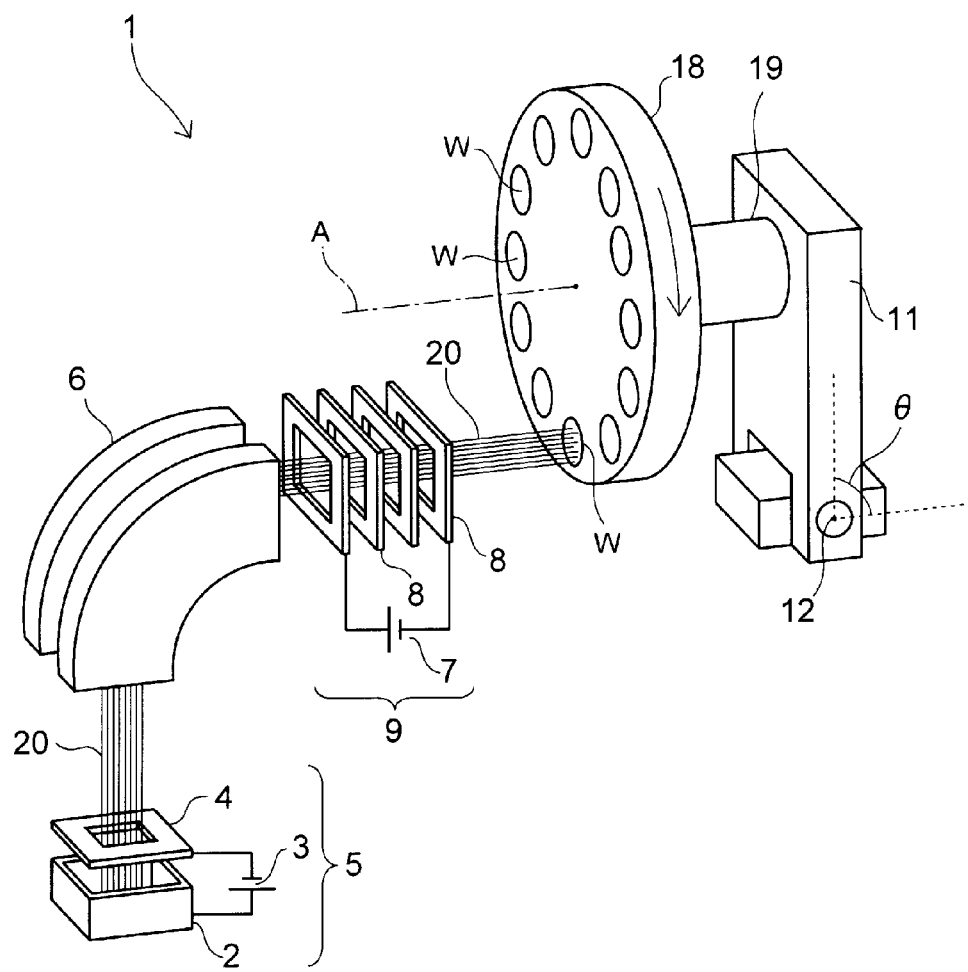
FIG. 1 is a perspective view of an ion implantation apparatus.

FIG. 1 is a perspective view of an ion implantation apparatus according to this embodiment.

The ion implantation apparatus 1 includes an ion beam generator 5 which generates ion beams 20. The ion beam generator 5 includes a plasma generator which generates plasma by electron cyclotron resonance (ECR) discharge, and an extraction electrode 4 which extracts therefrom the ion beams by the action of electric field. Between the extraction electrode 4 and the plasma generator 2, an extraction voltage $V_E$ is applied by a direct-current extraction power supply 3.

The plasma generator 2 houses a gas or material for generating target ions. For example, when boron, which is a p-type impurity, is to be ion-implanted, the plasma generator 2 houses a boron fluoride gas ($BF_3$) or a diborane gas ($B_2H_6$).

Moreover, the ion implantation apparatus 1 includes a mass analyzing magnet 6 which only selects ion species having a specific mass number, from among the ion beams 20, by the action of magnetic field.

The ion beams 20 pass through the mass analyzing magnet 6, and then enter an accelerator 9 so as to be accelerated by a predetermined acceleration voltage.

The accelerator 9 includes multiple stages of electrodes 8. Between both ends of the electrodes 8, an acceleration voltage $V_A$ is applied by an acceleration power supply 7. The ion beams 20 are accelerated by the acceleration voltage $V_A$, and then come out of the accelerator 9.

At the latter stage of the accelerator 9, there is provided a disk 18 which holds multiple semiconductor substrates W along its outer periphery, and which is rotatable about a first axis A by using a motor 19. With a rotation of the disk 18, the multiple semiconductor substrates W are sequentially exposed to the ion beams 20. This enables batch processing in which ion implantation is collectively performed on the semiconductor substrates W.

The motor 19 is fixed on an arm 11. The arm 11 is rotatable about an axle 12 by using an unillustrated gear or air cylinder, and is raised up by an angle θ from the horizontal plane during the ion implantation as illustrated in FIG. 1. Fine adjustments to the angle θ can be made depending on the angle of ion implantation into the semiconductor substrates W.

For example, when the semiconductor substrate W is perpendicularly irradiated with the ion beams 20, θ=90° is selected. Meanwhile, when the ion implantation is performed obliquely on the semiconductor substrate W, θ=83 is selected, which is obtained by tilting the angle by a tilt angle (for example, 7°) from the right angle.

On the other hand, before or after the ion implantation, the arm 11 lies horizontally (θ=0). Within the horizontal plane, the loading and receiving of the semiconductor substrate W is carried out between a transfer robot and the disk 18.

Then, after the completion of the loading and receiving of the semiconductor substrate W, the rotation plane of the disk 18 is raised up from the horizontal plane to the vertical plane, by the arm 11 which is mechanically connected to the disk 18.

Figure 2:
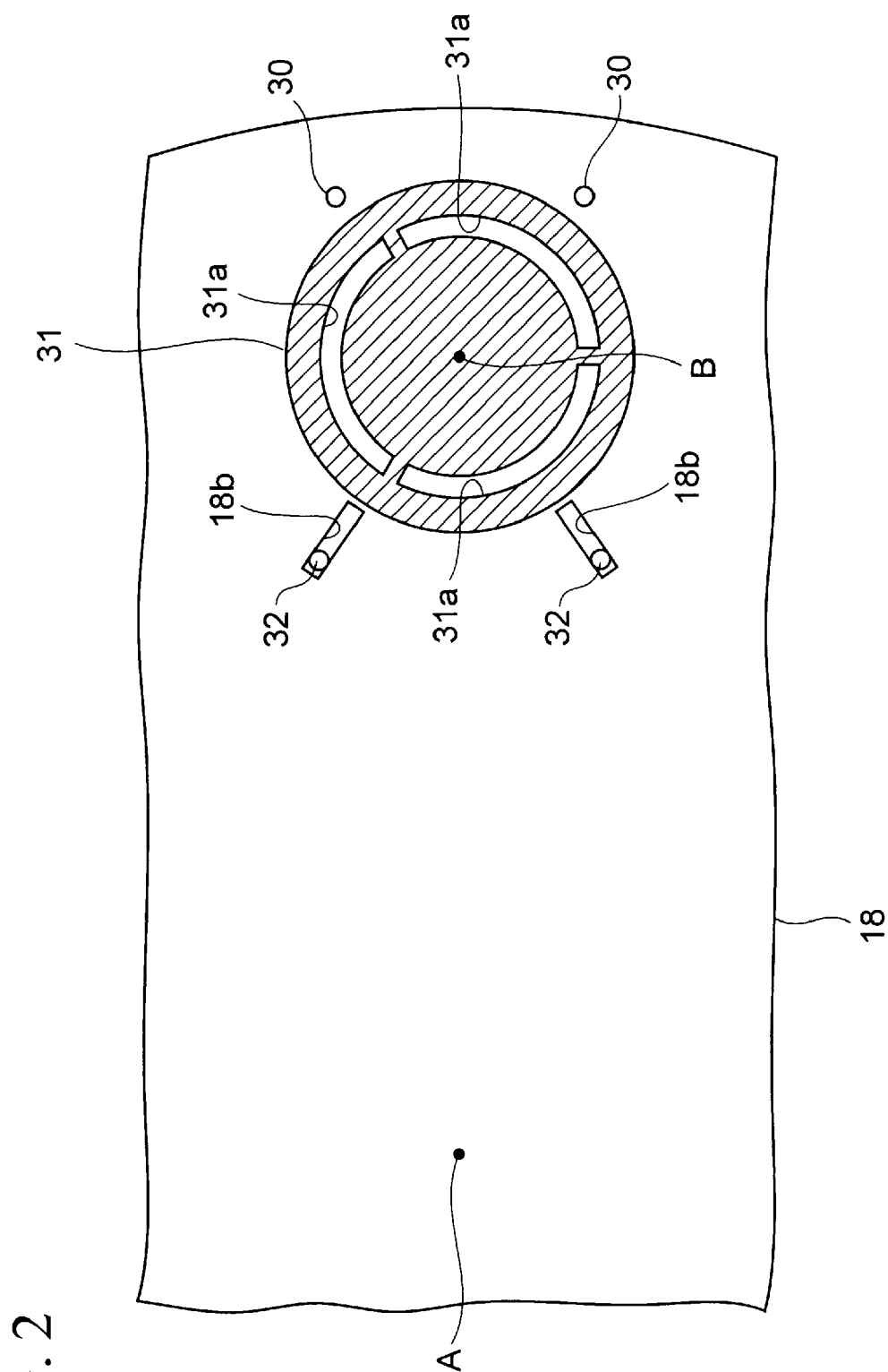
FIG. 2 is a plan view of a clamping mechanism.

FIG. 2 is a plan view of a substrate clamping mechanism which is provided near the periphery of the disk 18.

Pads 31, which are each rotatable about a second axis B, are provided on the periphery of the disk 18. Since the semiconductor substrate W is to be placed on each pad 31, the pad 31 is preferably made of a soft material such as silicon rubber, in order to prevent the damage to a back surface of the semiconductor substrate W.

In addition, multiple fixing pins (fixing pieces) 30 made of stainless steel are fixed on the disk 18 around the pads 31

Then, sliding pins (sliding pieces) 32, which slides along grooves 18b of the disk 18, are provided on the disk 18 respectively at positions closer to the first axis A than the fixing pins 30 are. The sliding pin 32 is made of stainless steel, for example.

In this embodiment, the pads 31 and the pins 30, 32 are provided on the outer periphery of the disk 18 so as to correspond to each of the semiconductor substrates W.

Figure 3:
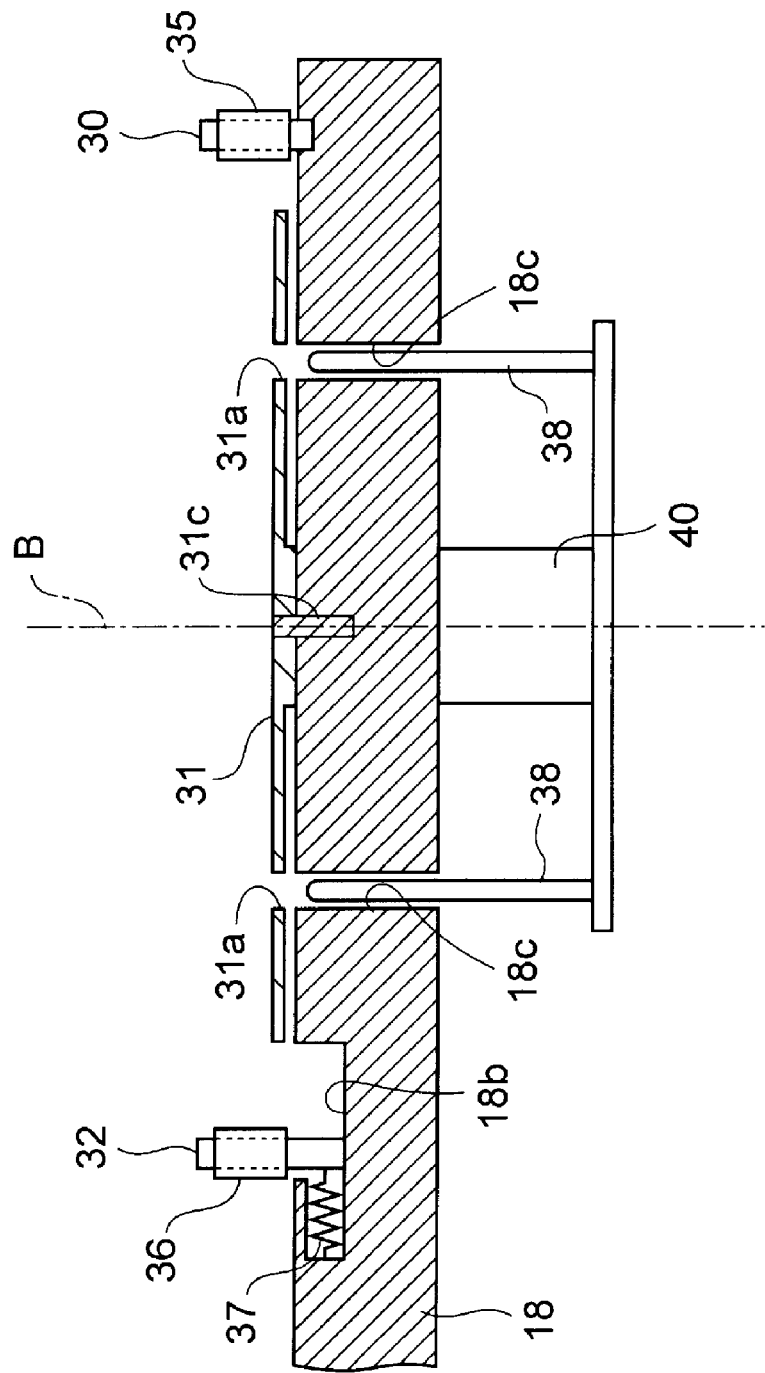
FIG. 3 is an enlarged cross-sectional view of a disk.

FIG. 3 is an enlarged cross-sectional view of the disk 18.

As depicted in FIG. 3, the pad 31 is rotatable about the second axis B by using a rotating pin 31c embedded in the disk 18.

Additionally, the fixing pin 30 and the sliding pin 32 are protruding from a front surface of the disk 18. Provided on the outer circumferences of the pins 30, 32 are rotation rings 35, 36, which are rotatable about the pins 30, 32 respectively, and are made of stainless steel or the like.

In addition, a spring (biasing member) 37, which biases the sliding pin 32 toward the first axis A (see FIG. 2), is fixed between a lower end of the sliding pin 32 and the disk 18. Because of the action of the spring 37, the sliding pin 32 is pulled toward the first axis A within the groove 18b when the rotation of the disk 18 is stopped.

In addition, multiple through holes 18c are provided in the disk 18, and a lift pin 38 is inserted into each of the through holes 18c. Each lift pin 38 is movable up and down by an actuator 40, which is fixed to the disk 18.

An opening portion 31a, through which the lift pin 38 passes, is provided in the pad 31. The lift pin 38 moves up in the through hole 18c, and then protrudes from a top surface of the pad 31 through the opening portion 31a.

Figure 4:
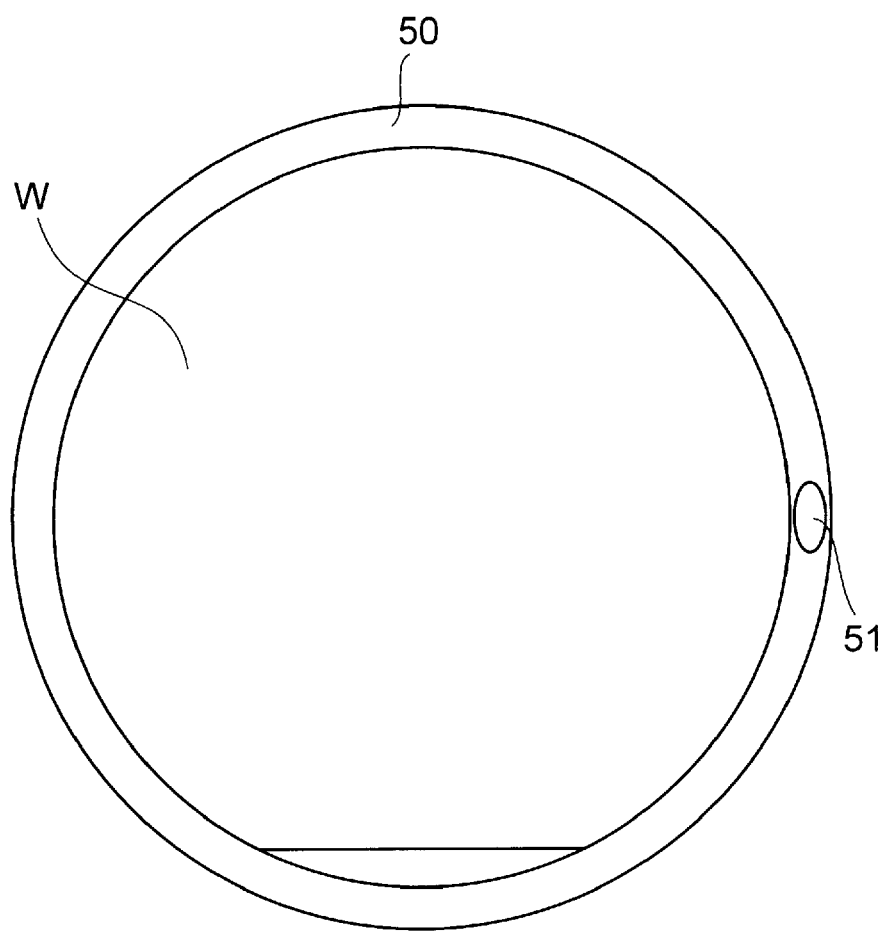
FIG. 4 is a top view of a holder.

FIG. 4 is a top view of a holder 50 for use in this embodiment.

The holder 50 is made of a metal material such as stainless steel, and is attached to the circumference of the semiconductor substrate W during the ion implantation. A weight 51 is provided to a part of the holder 50. The weight 51 is made of a material having a relative density larger than that of a constituent material of the holder 50. For example, the weight 51 is formed by embedding lead in the holder 50. Instead of embedding the different material in the holder 50 in this manner, the weight 51 may be formed by making a part of the holder 50 protrude from the holder 50.

Figure 5:
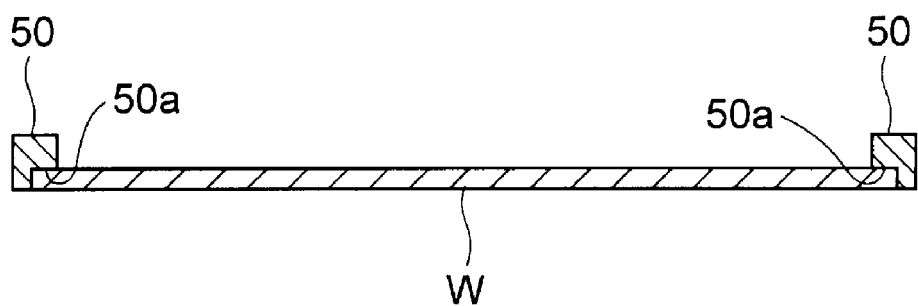
FIG. 5 is a cross-sectional view of a semiconductor substrate with the holder attached thereon.

FIG. 5 is a cross-sectional view of the semiconductor substrate W with the holder 50 attached thereto.

As illustrated in FIG. 5, a fringe 50a, which presses down the semiconductor substrate W from above, is provided to the holder 50.

Figure 6:
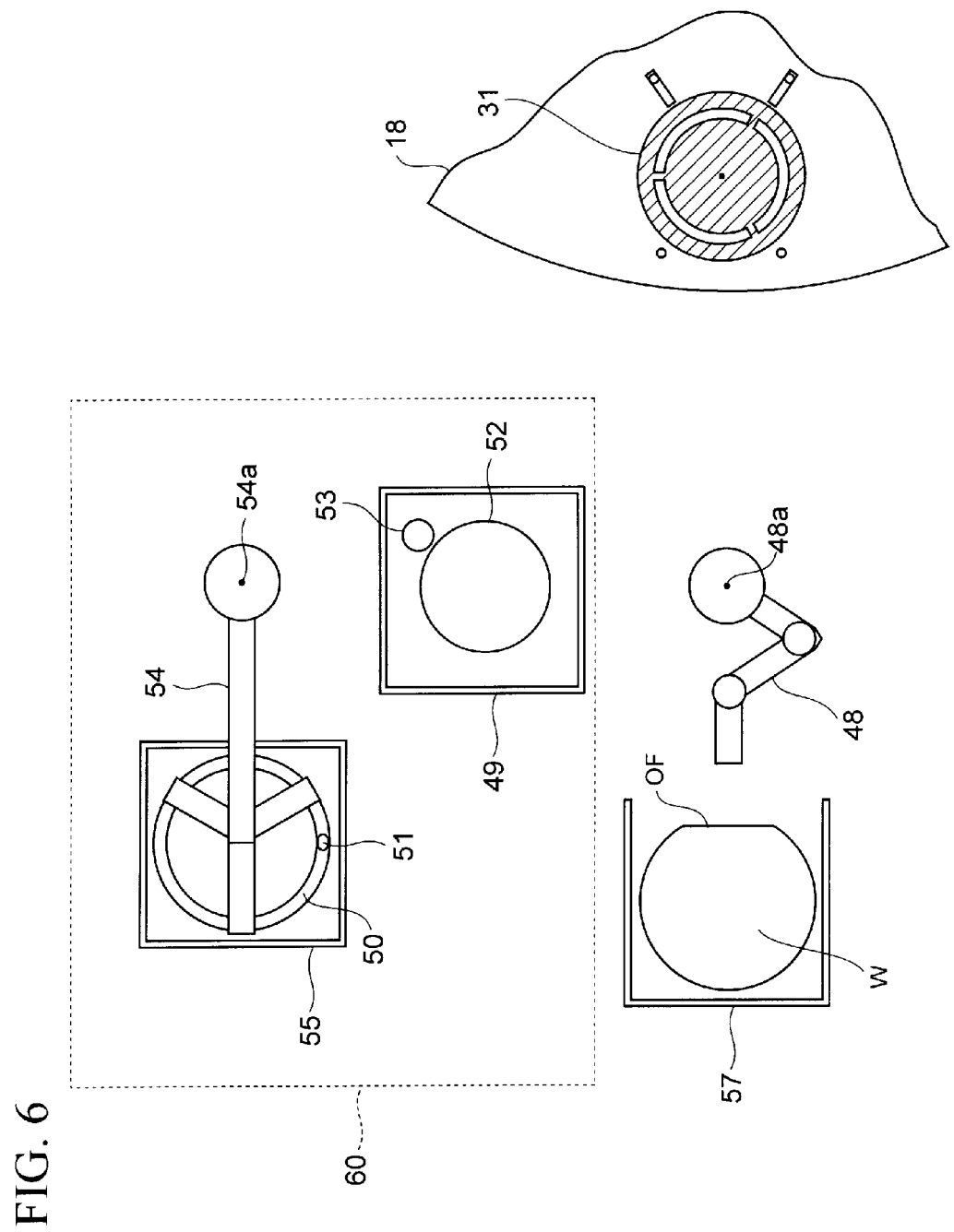
FIG. 6 is a plan view of robots, which transfer the semiconductor substrate to the disk, and their surrounding areas.

FIG. 6 is a plan view of robots and their surroundings, where the robots transfer the semiconductor substrate W to the disk 18.

A first robot 48, a second robot 54 and an aligner 49 are provided to the ion implantation apparatus 1.

Among these, the first robot 48 is rotatable about an axle 48a, and transfers the semiconductor substrate W between a wafer cassette 57, the aligner 49 and the disk 18. Here, the wafer cassette 57 houses the multiple semiconductor substrates W.

The second robot 54 transfers the holder 50 between a holder cassette 55 and the aligner 49. Here, holder cassette 55 has the multiple holders 50 stacked thereon.

In addition, the aligner 49 includes a stage 52 which is rotatable and on which the semiconductor substrate W is placed, and an orientation flat detection mechanism 53 which specifies the position of an orientation flat OF of the semiconductor substrate W. In the orientation flat detection mechanism 53, the periphery of the semiconductor substrate W is irradiated with laser beams from above while the semiconductor substrate W is being rotated by the stage 52. In the orientation flat OF, the laser beam is not blocked by the semiconductor substrate W. Therefore, the position of the orientation flat OF can be specified by detecting the laser beams by using a light receptor which is provided bellow a back surface of the semiconductor substrate W.

It should be noted that even when the semiconductor substrate W is provided with a notch instead of the orientation flat, the position of the notch can be specified by the aligner 49.

In this embodiment, the aligner 49, the second robot 54 and the holder cassette 55 constitute a holder attaching unit 60.

Loading/Unloading Method

Figure 7A:
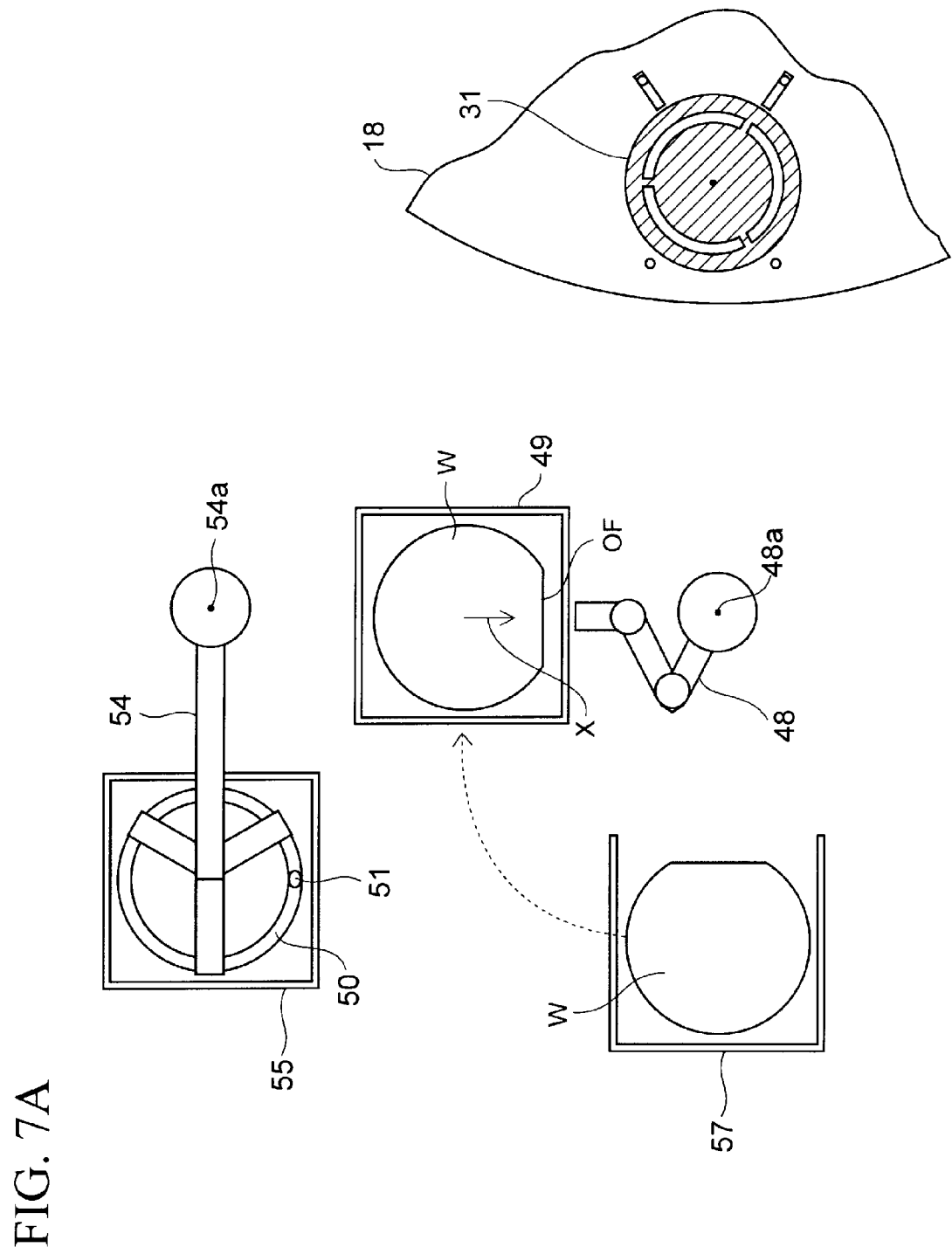
FIGS. 7A to 7C are schematic views each illustrating a method in which the robots load the semiconductor substrate onto the disk.
Figure 7B:
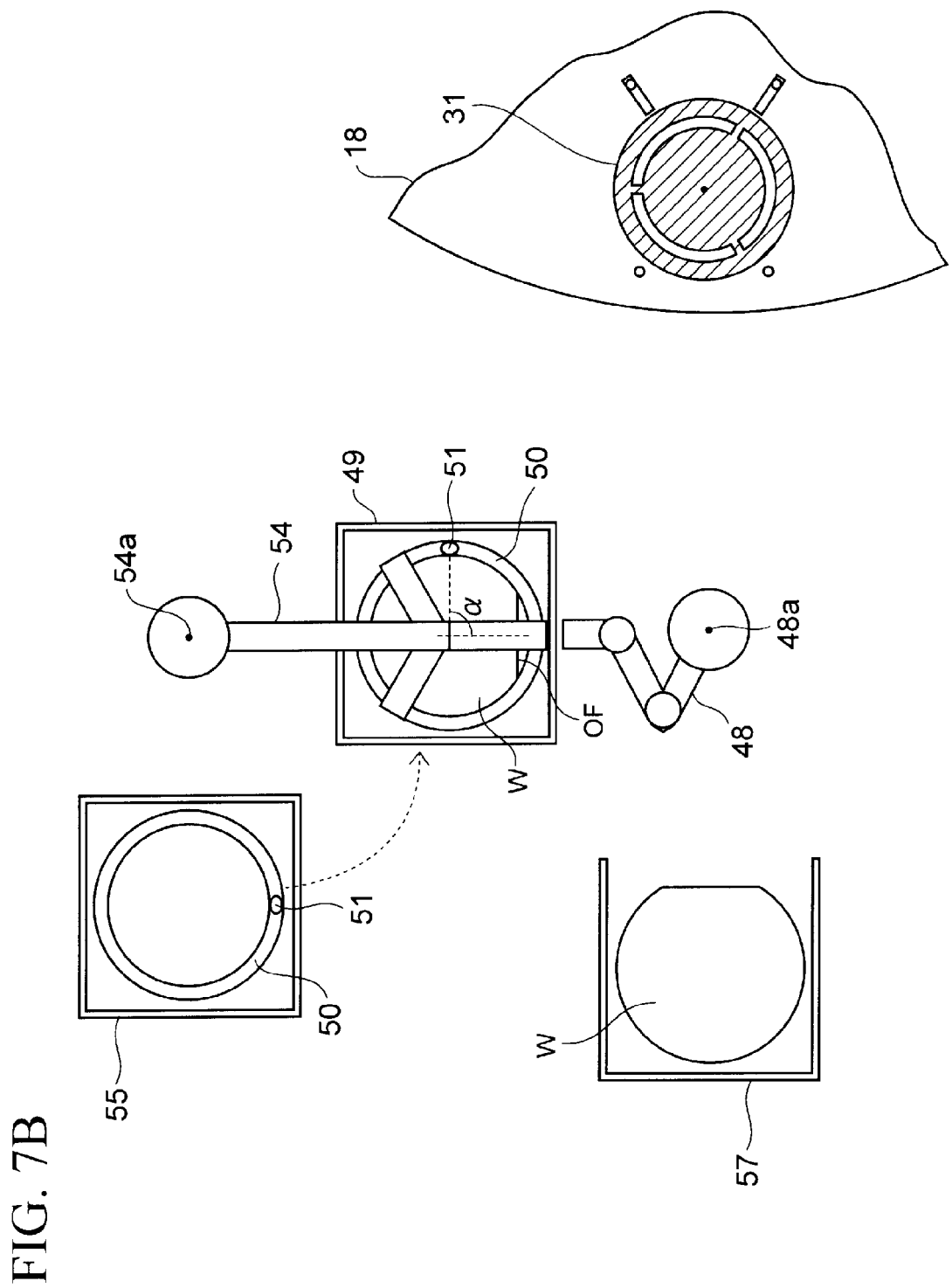
Figure 7C:
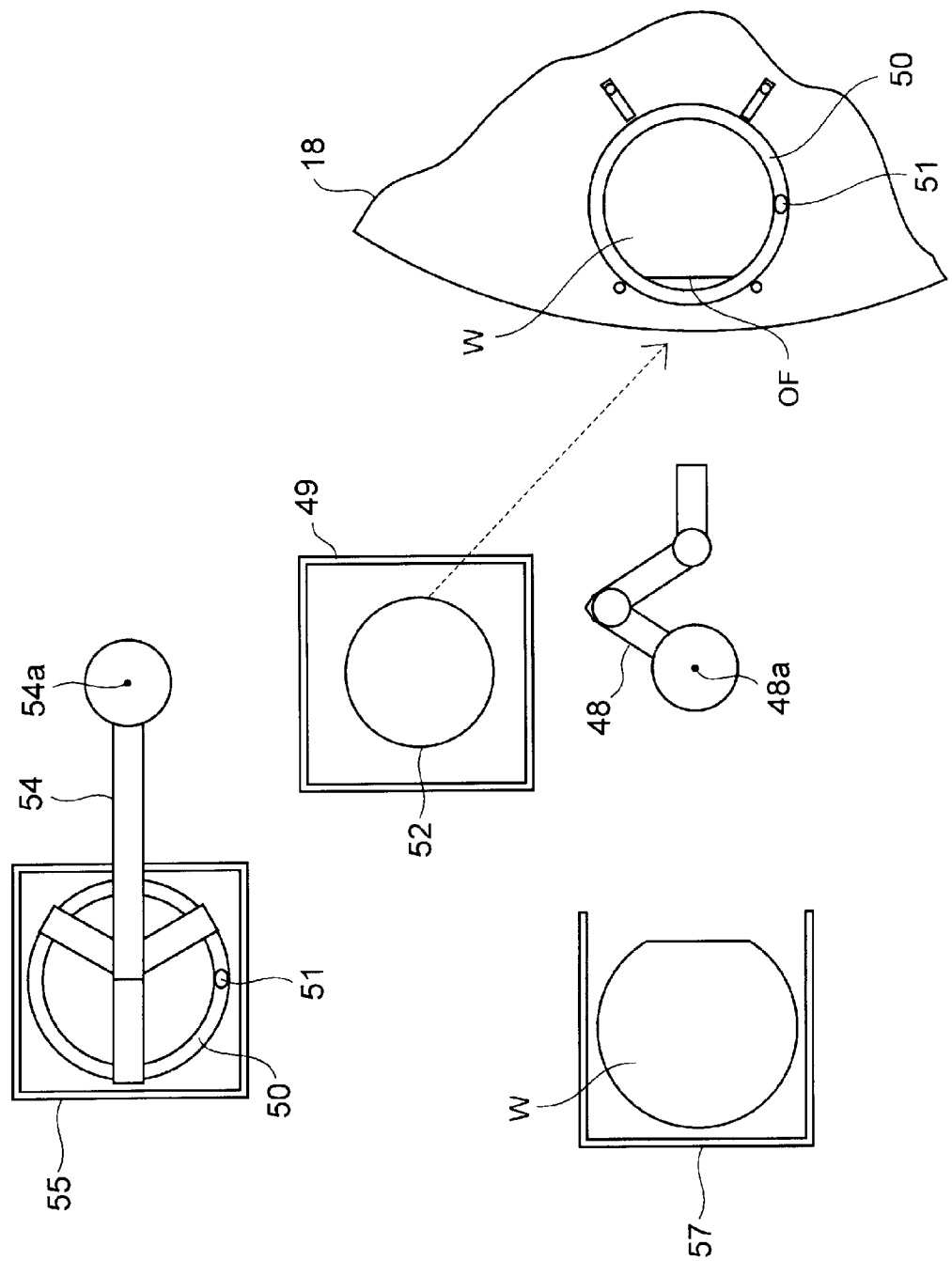

FIGS. 7A to 7C are schematic views each illustrating a method in which the first and second robots 48, 54 load the semiconductor substrate W onto the disk 18.

In order to load the semiconductor substrate W onto the disk 18, the first robot 48 causes the back surface side of the semiconductor substrate W to attach thereto and thereby transfers the semiconductor substrate W from the wafer cassette 57 to the aligner 49, as illustrated in FIG. 7A.

Then, in the aligner 49, the position of the orientation flat OF of the semiconductor substrate W is specified, and then the semiconductor substrate W is set to such a state where the orientation flat OF is oriented in a predetermined direction X In addition, at this time, the position of the weight 51 is predetermined in the holder cassette 55. For example, the multiple holders 50 are stacked on top of one another so that each of the weights 51 is positioned on the lower side of FIG. 7A.

Next, as illustrated in FIG. 7B, the uppermost one of the holders 50 stacked in the holder cassette 55 is grasped from above by using the second robot 54, and is then attached to the semiconductor substrate W from above.

At this time, when viewed from the center of the semiconductor substrate W, the orientation flat OF and the weight 51 are away from each other by an angle α. The angle α can be freely set by presetting the direction X (see FIG. 7A) of the orientation flat OF in the aligner 49. In this manner, the holder 50 can be attached to the semiconductor substrate W so that the weight 51 would be positioned at a predetermined position of the substrate W.

Subsequently, as illustrated in FIG. 7C, the semiconductor substrate W with the holder 50 is transferred onto the disk 18 by using the first robot 48. As illustrated in FIG. 7C, at this stage, the disk 18 is laid in a horizontal plane.

Figure 8C:
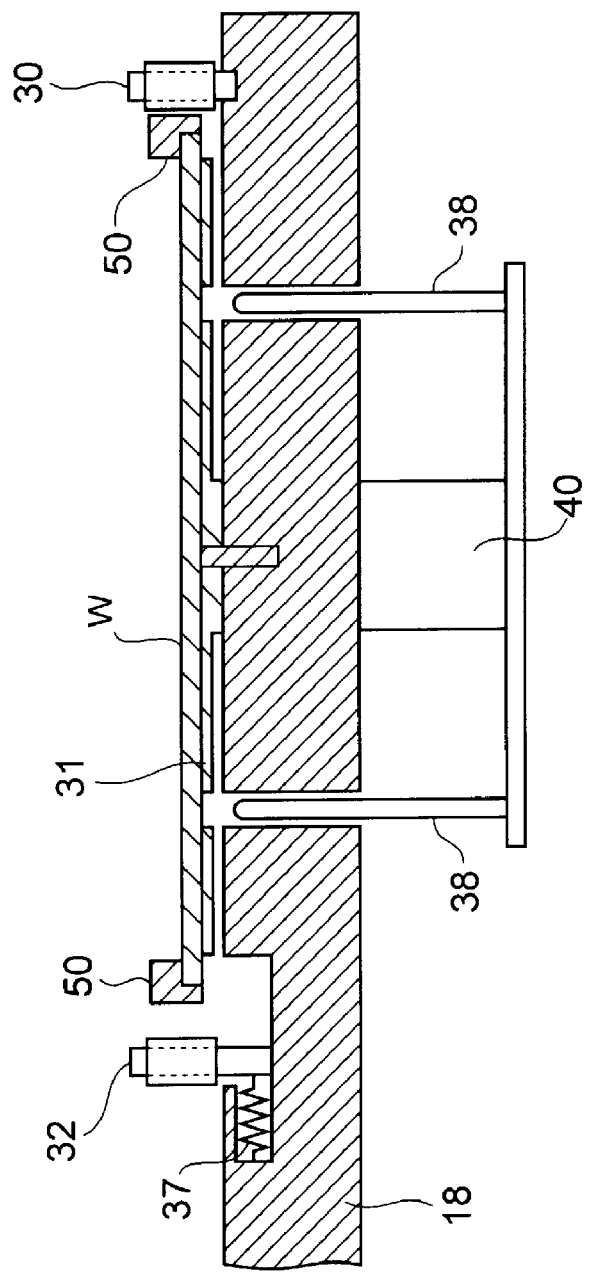

FIGS. 8A to 8C are cross-sectional views each for explaining the giving and receiving of the semiconductor substrate W on the disk 18.

As illustrated in FIG. 8A, when the semiconductor substrate W is transferred onto the disk 18 by the first robot 48, the lift pins 38 are lowered.

Subsequently, as illustrated in FIG. 8B, by moving upward the lift pins 38, the semiconductor substrate W and the holder 50 are raised, and then the first robot 48 is retracted.

Thereafter, as illustrated in FIG. 8C, by moving downward the lift pins 38, the semiconductor substrate W and the holder 50 are placed on the pad 31.

At this time, since the sliding pin 32 is separated from the substrate W by a biasing force of the spring 37, the semiconductor substrate W can be smoothly housed in a space between the pins 30 and 32. Accordingly, severe alignment accuracy is not required between the pins 30, 32 and the substrate W. This makes trouble less likely to occur when the semiconductor substrate W is transferred from the robot 48 to the disk 18.

Thus, the loading of the semiconductor substrate W onto the disk 18 is completed.

Note that, when the semiconductor substrate W is unloaded from the disk 18 after completion of the ion implantation, the above-mentioned flow may be followed in a reverse manner.

Ion Implantation Method

Next, description is given of an ion implantation method in the ion implantation apparatus 1 loaded with the semiconductor substrate W in the above-mentioned manner.

In batch-type ion implantation, the orientation of the orientation flat OF of the semiconductor substrate W on the disk 18 affects the semiconductor devices to be formed on the semiconductor substrate W.

For example, when the angle θ between the arm 11 (see FIG. 1) and the horizontal plane is smaller than 90° as in the case of performing oblique ion implantation, the ion beams 20 are obliquely incident on the semiconductor substrates W. In this case, if the direction of the orientation flats OF on the disk 18 differ among the semiconductor substrates W, the extending direction of the device pattern such as gate electrodes and the irradiation direction of the ion beams 20 also differ among the semiconductor substrates W. For this reason, the electrical characteristics of the semiconductor devices formed on the semiconductor substrates W vary among the semiconductor substrates W.

As described below, the use of the ion implantation apparatus 1 according to this embodiment allows the direction of the orientation flat OF on the disk 18 to be automatically aligned in one direction, and thus to easily eliminate the above-mentioned inconveniences.

Figure 9:
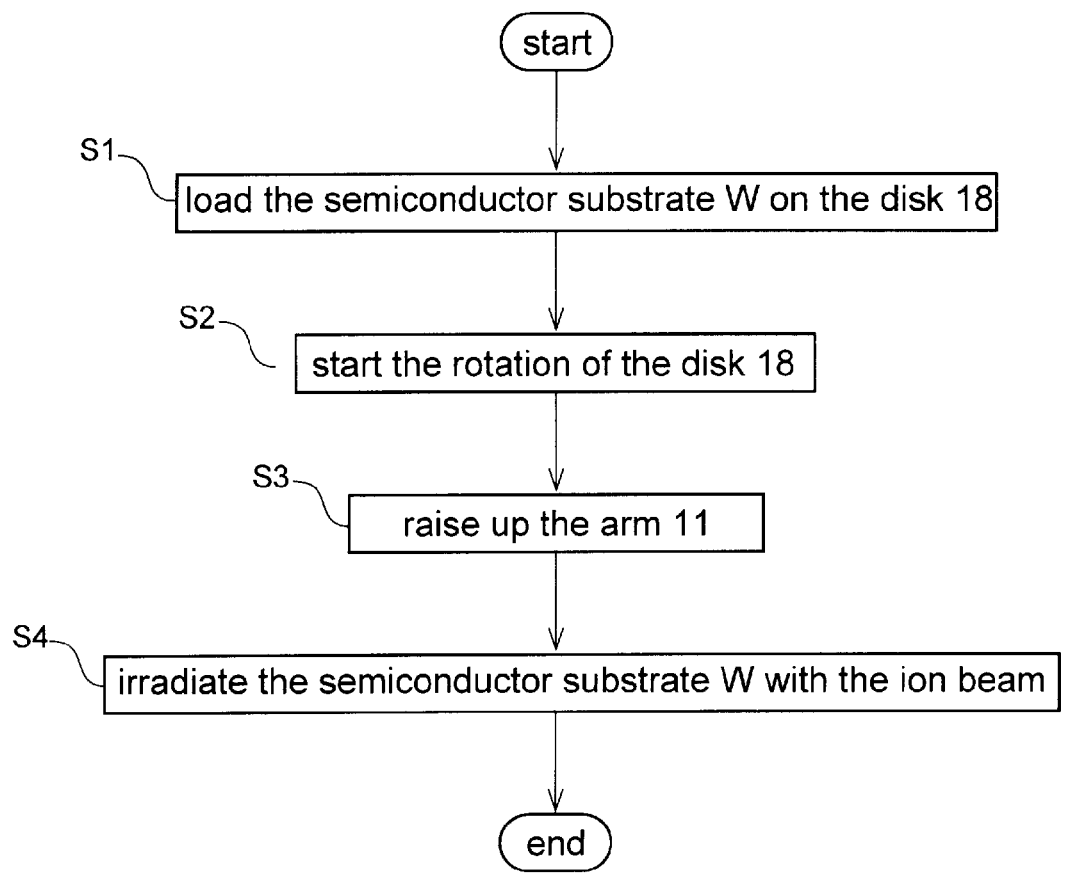
FIG. 9 is a flowchart for explaining ion implantation.

FIG. 9 is a flowchart for explaining ion implantation according to this embodiment.

Figure 10A:
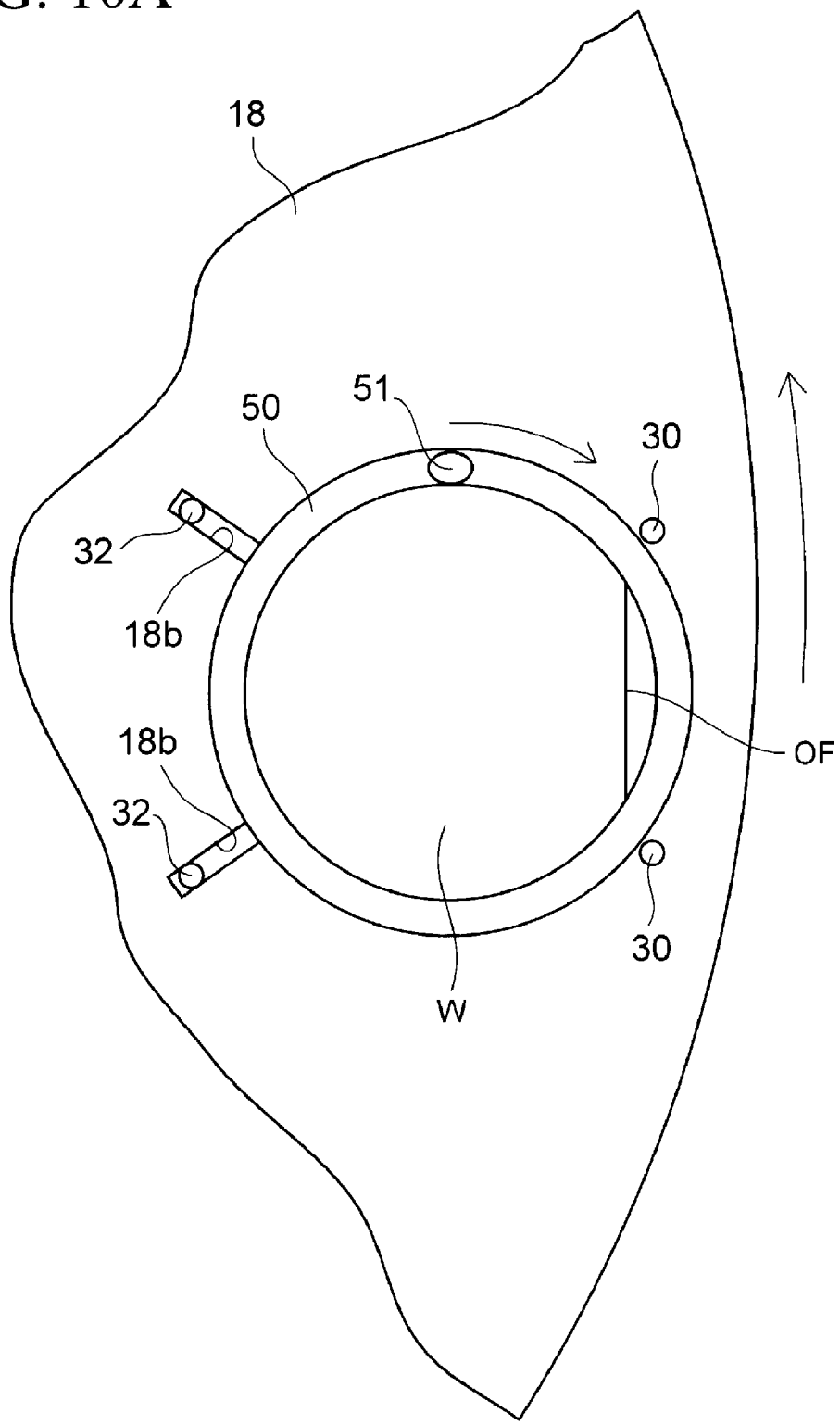
FIGS. 10A and 10B are plan views for explaining the ion implantation.
Figure 10B:
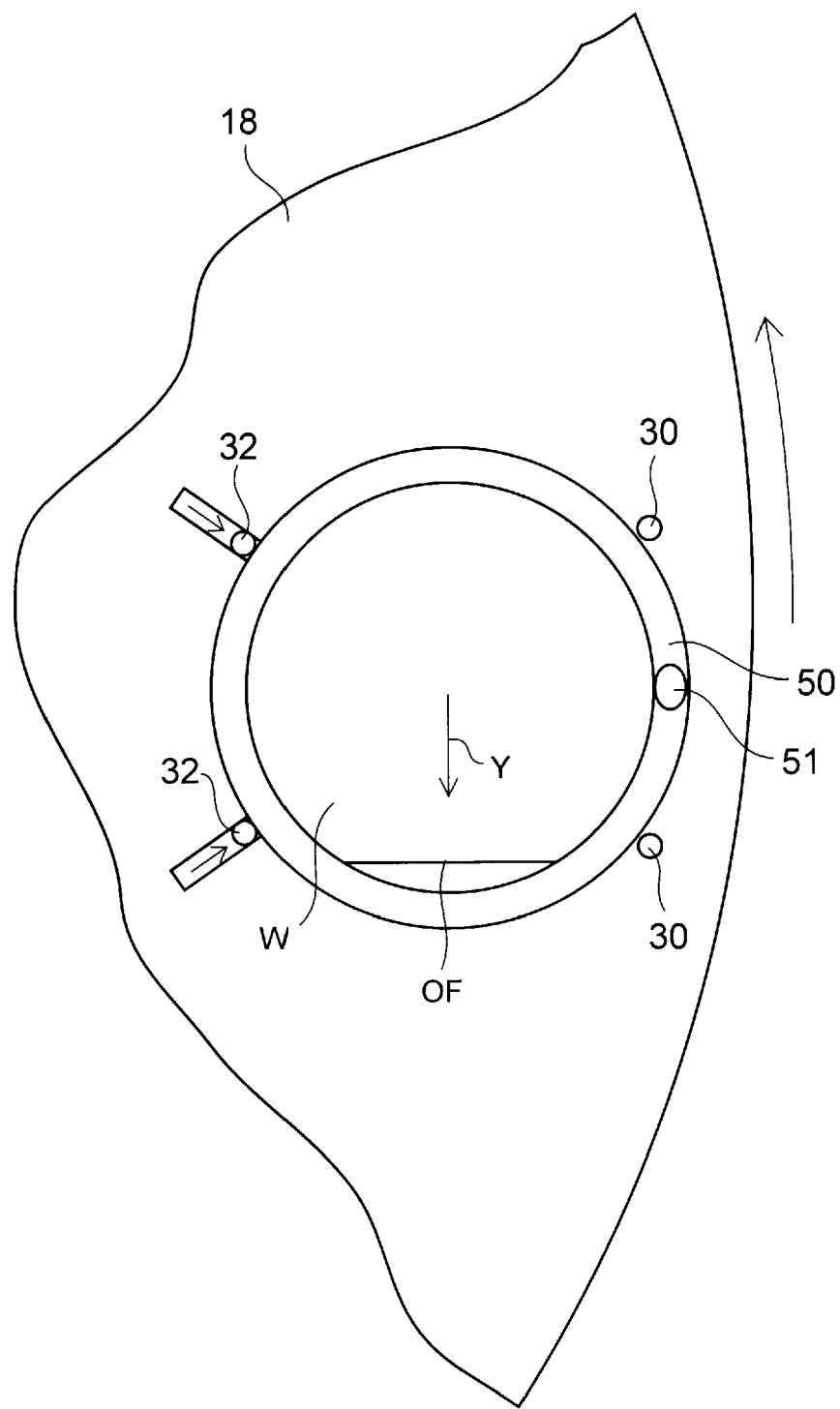

In addition, FIGS. 10A and 10B are plan views for explaining the ion implantation according to this embodiment.

In the first step S1 in FIG. 9, the semiconductor substrate W is loaded on the horizontally lying disk 18 in accordance with the above-mentioned method.

In the next step S2, while the arm 11 (see, FIG. 1) is laid horizontally, the rotation of the disk 18 in the horizontal plane is started, as illustrated in FIG. 10A. Although not particularly limited, the number of rotations is approximately 50 rpm in this embodiment.

Once the rotation of the disk 18 is started, the weight 51 begins to move, by its own centrifugal force, in the outer peripheral direction of the disk 18. With this centrifugal force, the holder 50 rotates while pressing the semiconductor substrate W against the pad 31 (see, FIG. 2). Then, the rotation of the pad 31 stops when the weight 51 is positioned at the outer periphery of the disk 18, as illustrated in FIG. 10B.

In this manner, the directions of orientation flats OF on the disk 18 are automatically aligned in a predetermined direction Y on the disk 18. The direction Y is freely changeable by changing the angle α described in FIG. 7B.

Figure 11:
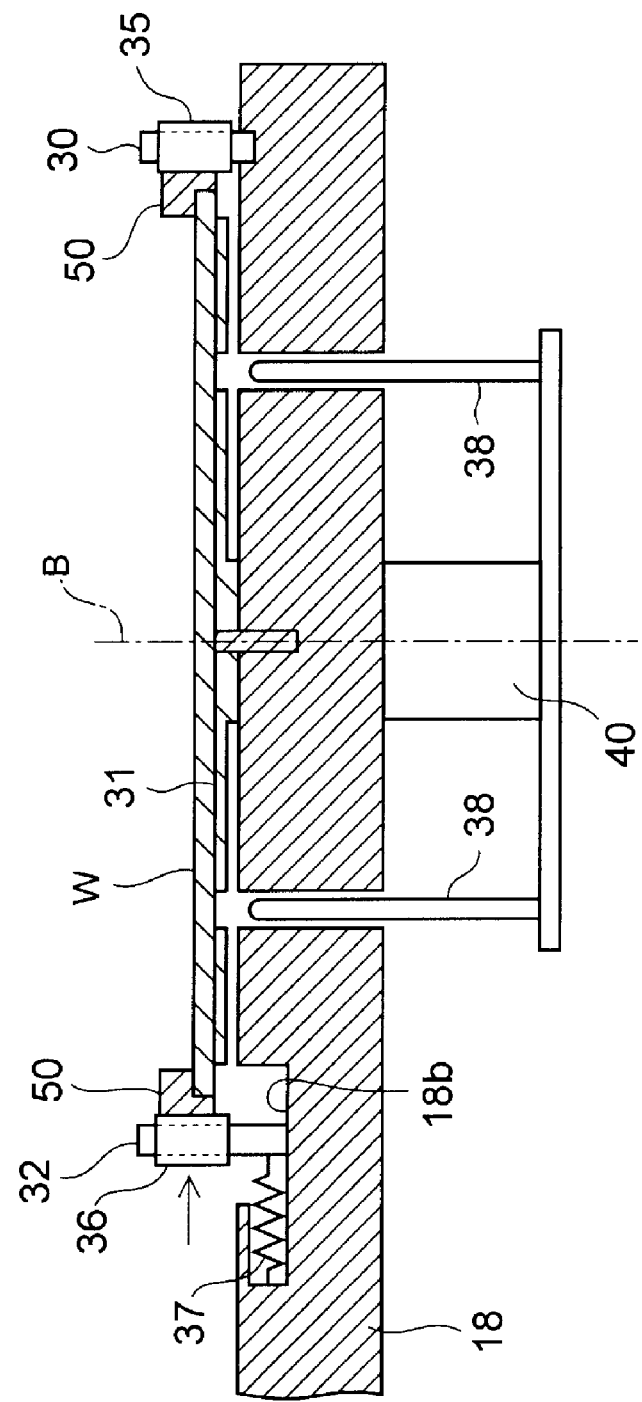
FIG. 11 is an enlarged cross-sectional view of the vicinity of the semiconductor substrate in a state where the disk is rotating.

FIG. 11 is an enlarged cross-sectional view of the vicinity of the semiconductor substrate W when the disk 18 is rotating.

With the rotation of the disk 18, the movable pins 32 begin to resist the biasing force of the spring 37 and thus to slide in the outer peripheral direction of the disk 18. Ultimately, the movable pins 32 clamp the holder 50 laterally in cooperation with the fixing pins 30.

Here, the rotation rings 35 and 36, which come in contact with the outer circumferential side surface of the holder 50, are provided to the pins 30 and 32 respectively. Accordingly, even when the holder 50 is clamped by the pins 30 and 32, the rotation of the holder 50 about the axis B is assisted, and hence the alignment of the orientation flat OF in the above-described manner is not hindered due to the rotation of the holder 50.

Subsequently, proceeding to step S3, the lying arm 11 (see, FIG. 1) is raised up while the disk 18 is rotating with such a number of rotations that the holder 50 can be clamped by the pins 30 and 32. In this regard, the angle θ between the arm 11 and the horizontal plane is set appropriately depending on the angle of the ion implantation.

Thereafter, proceeding to step S4, the ion implantation into the semiconductor substrate W is performed by irradiating the substrate W with the ion beams 20 while the disk 18 is rotating, and thereby impurity diffusion regions such as source/drain regions and wells are formed in the semiconductor substrate W.

Thus, basic steps of the ion implantation according to this embodiment are completed.

According to this embodiment described above, the rotatable pad 31 and pins 30 and 32 constitute the substrate clamping mechanism, as illustrated in FIGS. 2 and 3.

In this substrate clamping mechanism, the semiconductor substrate W is pressed against the pad 31 by the holder 50 provided with the weight 51 as described with reference to FIGS. 10A and 10B. Accordingly, the holder 50 and the semiconductor substrate W rotate together with the pad 31 by the centrifugal force of the weight 51, and thereby the directions of the orientation flat OF of the substrates W can be automatically aligned in a simple manner.

Thus, the extending direction of the device pattern such as gate electrodes are oriented in the same direction with respect to the irradiation direction of the ion beams 20 in each of the multiple semiconductor substrates W, and thereby the semiconductor devices formed on each semiconductor substrate W can be made to have uniform electrical characteristics.

Moreover, as illustrated in FIG. 11, in the substrate clamping mechanism according to this embodiment, the sliding pin 32 slides, by its own centrifugal force, with the rotation of the disk 18 so as to clamp the holder 50. Accordingly, the semiconductor substrate W can be stably held even when the disk 18 rotates rapidly, and thereby the semiconductor substrate W hardly drops off from the disk 18 during the ion implantation.

In addition, since the circular holder 50 is attached to the semiconductor substrate W, the semiconductor substrate W can be clamped between the pins 30 and 32, irrespective of the direction of the orientation flat OF. Accordingly, the semiconductor substrate W is prevented from dropping off from the disk 18 due to the positional relationship between the orientation flat OF and the pins 30 and 32.

While this embodiment has been described in detail above, the present invention is not limited to the above-described embodiment. Although the semiconductor substrate W having the orientation flat OF formed therein is used in the above-described embodiment, the semiconductor substrate W having a notch formed therein instead of the orientation flat OF may be used, for example.

What is claimed is:

1. An ion implantation apparatus comprising:
   a disk which rotates about a first axis;
   a pad which is rotatable about a second axis on the disk, and on which a substrate is placed with a holder attached to a circumference of the substrate, the holder including a weight;
   a fixing piece which is fixedly provided to a portion of the disk around the pad;
   a sliding piece which slides, by its own centrifugal force, on the disk by a rotational movement of the disk and thereby clamps the holder in cooperation with the fixing piece; and
   an ion beam generator which irradiates the substrate with an ion beam.

2. The ion implantation apparatus according to claim 1, further comprising a biasing member which biases the sliding piece toward the first axis, wherein the sliding piece slides, by its own centrifugal force, in an outer peripheral direction of the disk while resisting the biasing member during a rotation of the disk.

3. The ion implantation apparatus according to claim 1, wherein
   the sliding piece is provided at a portion closer to the first axis than the fixing piece is.

4. The ion implantation apparatus according to claim 1, wherein
   a rotation ring is provided to at least one of the fixing piece and the sliding piece, and
   the rotation ring assists the holder to rotate about the second axis by being in contact with an outer circumferential side surface of the holder.

5. The ion implantation apparatus according to claim 1, wherein
   at least one of the fixing piece and the sliding piece is a pin protruding from a front surface of the disk.

6. The ion implantation apparatus according to claim 1, further comprising a lift pin which lifts the substrate from the pad and thereby makes a space between the pad and the substrate in order for a transfer robot to enter the space.

7. The ion implantation apparatus according to claim 6, wherein
   the pad is provided with an opening portion, and
   through the opening portion, the lift pin lifts the substrate from the pad.

8. The ion implantation apparatus according to claim 1, further comprising a holder attaching unit which attaches the holder to the substrate so that the weight is positioned at a predetermined position of the substrate.

9. The ion implantation apparatus according to claim 8, wherein
   the holder attaching unit includes:
      an aligner which aligns an orientation flat or a notch of the substrate with a predetermined direction; and
      a robot which attaches the holder to the substrate with the orientation of the substrate aligned by the aligner.

10. The ion implantation apparatus according to claim 1, further comprising an arm which is mechanically connected to the disk, and which raises a rotation plane of the disk from a horizontal plane to a vertical plane.

11. A substrate clamping mechanism comprising:
    a pad which is provided rotatably about a second axis on a disk configured to rotate about a first axis, and on which a substrate is placed with a holder attached to a circumference of the substrate, the holder including a weight;
    a fixing piece which is fixedly provided to a portion of the disk around the pad; and
    a sliding piece which slides, by its own centrifugal force, on the disk by a rotational movement of the disk and thereby clamps the holder in cooperation with the fixing piece.

12. The substrate clamping mechanism according to claim 11, further comprising a biasing member which biases the sliding piece toward the first axis, wherein the sliding piece slides, by its own centrifugal force, in an outer peripheral direction of the disk while resisting the biasing member during a rotation of the disk.

13. The substrate clamping mechanism according to claim 11, wherein
    a rotation ring is provided to at least one of the fixing piece and the sliding piece, and
    the rotation ring assists the holder to rotate about the second axis by being in contact with an outer circumferential side surface of the holder.

14. An ion implantation method comprising:

placing a substrate on a rotatable pad on a disk with a holder attached to a circumference of the substrate, the holder including a weight;

pressing a sliding piece provided on the disk against the holder by a centrifugal force of the sliding piece by a rotation of the disk, and thereby clamping the holder by the sliding piece and a fixing piece fixedly provided on the disk; and, after the clamping, irradiating the substrate with an ion beam while rotating the disk.

15. The ion implantation method according to claim 14, further comprising:

placing the holder on the substrate so that the weight is positioned at a predetermined position of the substrate before placing the substrate on the pad.

16. The ion implantation method according to claim 14, wherein the placing of the substrate on the pad and the clamping of the holder are performed while the disk is rotating in a horizontal plane.

* * * * *